(12) United States Patent
Choate et al.

(10) Patent No.: US 6,440,567 B1
(45) Date of Patent: Aug. 27, 2002

(54) HALOGEN FREE FLAME RETARDANT ADHESIVE RESIN COATED COMPOSITE

(75) Inventors: Martin T. Choate, Onalaska; Barbara Ormond, LaCrosse, both of WI (US); Michael Nehls, Mezenid; Georg Czerny, Düren, both of (DE)

(73) Assignee: Isola Laminate Systems Corp., LaCrosse, WI (US)

( * ) Notice: Subject to any disclaimer, the term of this patent is extended or adjusted under 35 U.S.C. 154(b) by 0 days.

(21) Appl. No.: 09/716,067

(22) Filed: Nov. 17, 2000

Related U.S. Application Data

(60) Provisional application No. 60/193,971, filed on Mar. 31, 2000.

(51) Int. Cl.[7] .............................................. B23B 15/08
(52) U.S. Cl. ........................ 428/418; 523/451; 523/461
(58) Field of Search ................................. 523/451, 461; 428/418

(56) References Cited

U.S. PATENT DOCUMENTS

| | | |
|---|---|---|
| 4,180,496 A | 12/1979 | Yanagimoto et al. |
| 5,629,098 A | 5/1997 | Poutasse et al. |
| 5,674,611 A | 10/1997 | Saida et al. |
| 5,691,404 A | 11/1997 | Kasowski et al. |
| 5,708,065 A | 1/1998 | Martens et al. |
| 5,854,309 A | 12/1998 | Blount |
| 5,874,009 A | 2/1999 | Inada et al. |

FOREIGN PATENT DOCUMENTS

| | | |
|---|---|---|
| DE | 40 40 276 | 6/1992 |
| EP | 0 451 101 | 10/1991 |
| EP | 0 763 566 | 3/1997 |
| EP | 0 795 570 | 9/1997 |
| JP | 11333974 | * 12/1999 |

OTHER PUBLICATIONS

Database WPI Section Ch, Week 200008 Derwent Publications Ltd., London, GB; Class A85; AN 2000–092081 XP002183169 (Dec. 7, 1999).

Database WPI Section Ch, Week 199819 Derwent Publications Ltd., London GB, Class A21, AN 1998–212941 XP002183170 (Mar. 3, 1998).

* cited by examiner

*Primary Examiner*—Philip Tucker
*Assistant Examiner*—D. Aylward
(74) *Attorney, Agent, or Firm*—McDonnell Boehnen Hulbert & Berghoff

(57) ABSTRACT

Fire resistant adhesive resins that include a halogen-free and bromine-free flame retardant ingredient and conductive foils coated with the halogen-free fire resistant adhesive resin coated compositions of this invention as well as printed circuit boards manufactured using the adhesive resin coated conductive foils.

15 Claims, 1 Drawing Sheet

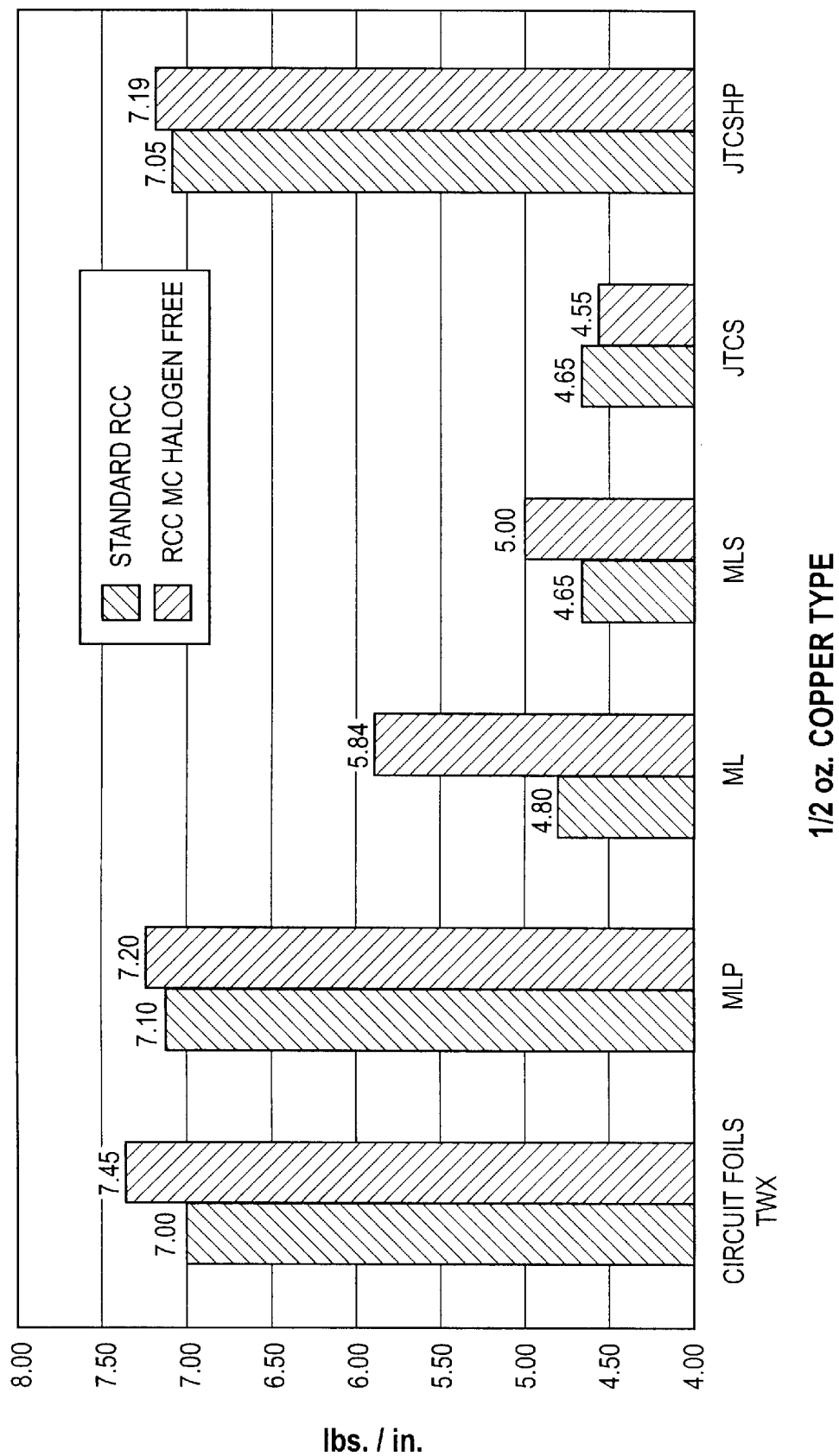

HALOGEN FREE FLAME RETARDANT ADHESIVE RESIN COATED COMPOSITE

This Application claims benefit of Provisional No. 60/193,971 filed Mar. 31, 2000.

BACKGROUND OF THE INVENTION (1) Field of the Invention

This invention concerns fire resistant adhesive resins that include a halogen-free and bromine-free flame retardant ingredient. This invention also includes conductive foils coated with the halogen-free fire resistant adhesive resin coated compositions of this invention as well as printed circuit boards manufactured using the adhesive resin coated conductive foils.

(2) Description of the Art

Prepregs, resin coated conductive foils, reinforced cores, and other substrates used in the manufacture of circuit boards typically include a resin component. Many of the resin ingredients are flammable. Therefore, flame-retardant ingredients are added to resins prior to use in order to produce flame retardant circuit board substrates and laminates. Commonly used flame retardant components are those that include a halogen such as bromine.

The use of halogen containing flame-retardant compounds in circuit board substrate resin formulations may create problems with disposal of used circuit board components. There is some concern that halogens such as bromine compound can leach from circuit board components following disposal in landfills. Therefore, there is a need for adhesive resin formulations that include a halogen free flame-retardant. In addition to being halogen free, there is a need for retardant fire resistant halogen-free adhesive resin compositions that produce circuit board substrate materials with high Tg's, low Dk's and low moisture absorption properties.

SUMMARY OF THE INVENTION

It is an object of this invention to provide a resin composition that includes a halogen free flame retardant composition. The composition is specifically formulated to chemically interact with surrounding thermoset resin matrix components to hasten curing kinetics (peak exotherm temperature) while preserving most of the system latency and to react with the resin ingredients to become an integral part of the cured resin backbone matrix. This feature of the compositions of the present invention enhances the 2-step coating manufacturing process described below and helps to minimize resin movement though faster C-staging and increase production rates.

It is another object of this invention to provide a conductive metal foil that is coated with a resin composition that includes a halogen free flame retardant composition wherein the resin coated conductive foil has good peel strengths.

It is still another object of this invention to provide resin coated conductive metal foils that are useful in the manufacture of circuit boards and other electronic laminates.

In one embodiment, this invention is a flame-retardant adhesive resin composition comprising at least one resin and from about 12 to about 17 wt % melamine cyanurate having a particle size of from about 1 micron to about 12 microns.

In yet another embodiment, this invention is a conductive metal foil having a first surface and a second surface wherein the first surface includes a flame-retardant resin layer comprising at least one resin, and at least one halogen-free flame retardant composition wherein the resin composition includes essentially no halogen containing flame-retardant compositions.

DESCRIPTION OF THE FIGURES

FIG. 1 is a plot comparing the peel strengths of copper foils coated with bromine containing resins with copper foils coated with resin including halogen-free flame retardant as described in Table 3 of Example 2.

DESCRIPTION OF THE CURRENT EMBODIMENT

The present invention relates to adhesive resin compositions that include at lest one halogen-free flame retardant ingredient. The present invention also includes prepregs, resin coated conductive foils, cores, and other electronic substrates and laminates that are useful in the manufacture of printed circuit boards that are manufactured from adhesive resin compositions of this invention.

The term "resin" as it is used herein has two meanings. First the term "resin" refers to discrete polymerizable compounds such as epoxy compounds, urethane compounds, and so forth. The term "resin" also refers to a mixture of ingredients including specific resin compounds that is used preferably as a conductive foil "adhesive".

Resins that are useful in the adhesive resin compositions of this invention may be any resin(s) that are useful in the manufacture of adhesive resin coated metal foils. Preferably, the resins are organic resin that have molecular weight greater that about 4500. The adhesive resin composition may include a combination of two or more resin compounds having the same or differing molecular weights and degrees of functionality. Two or more resins, having the same or different functionality and molecular weights can be advantageously combined in a formulation that results in a cured resin having a high Tg, and low Dk.

The resins used in the adhesive resin compositions of this invention will preferably be heat activated and the adhesive resin compositions will preferably have a viscosity range from about 900 to 2000 centipoise and preferably from about 1200 to about 1700 centipoise. The viscosity can be modified by altering the solids content or the resin ingredients used in the adhesive resin composition.

Examples of useful resins include bistriazine resins, phenoxy resins, bis-phenol epoxy resins, phenolic novolac resins, epoxidised phenolic novolac resins, urethane resins, polyvinyl acetate resins, and any other resins that alone or in combination are within the knowledge of one of ordinary skill in the art as useful in adhesive resin compositions. Further examples of useful resin and resin ingredients are disclosed in U.S. Pat. Nos. 5,674,611, 5,629,098, and 5,874,009, the specifications of each of which are incorporated herein by reference.

An important ingredient of the adhesive resin compositions of this invention is a halogen-free flame retardant ingredient. The halogen-free flame retardant component may be any halogen-free composition that reduces the flammability of the resin compositions of this invention. Examples of useful halogen-free fire retardant compositions include melamine cyanurate, melamine cyanurate encapsulated red phosphorous, phosphoric acid, 1,3-phenylenetetraphenyl ester, Di-polyoxyethylene, hydroxymethylphosphonate, and mixtures thereof. A preferred halogen-free flame retardant is melamine cyanurate.

The particle size of the melamine cyanurate should range from about 1 to about 20 microns. However, a melamine cyanurate particle size less than about 12 microns is preferred. Keeping the melamine cyanurate particle size less than 4 microns minimizes surface defects and resin wet-out problems.

Generally, the resin compositions of this invention will include from about 10 to 30 wt % of a halogen-free flame retardant composition and from about 70 to 90 wt % of one or more resin compounds. More preferably, the adhesive resin compositions of this invention will include from about 10 to about 20 wt % of one or more halogen-free flame retardant compounds and most preferably from about 12 to about 17 wt % halogen-free flame retardant compounds with the remainder being one or more resin compounds.

The mechanical and electrical properties of the resin compositions of this invention upon cure can be controlled somewhat by choice of the molecular weight of ingredients used in the adhesive resin composition of this invention. When phenoxy resin is used, the molecular weight should range from about 8000 to about 60,000 and preferably could be about 20,000.

The adhesive resin-compositions of this invention may include other ingredients and additives known to those of ordinary skill in the art to be useful in adhesive resin compositions. The adhesive resin compositions of this invention are particularly useful in preparing resin coated conductive foils, cores, and other substrates and laminates used in the manufacture of printed circuit boards. Most preferably, the adhesive resin composition of this invention are used in the manufacture resin coated conductive foils and, in particular, resin coated copper foils. Resin coated copper foils are manufactured by applying a layer of resin of this invention to one surface of a two surface conductive foil. Preferably, the thickness of resin applied to the foil surface produces a cured resin thickness of about 20 to about 100 microns. More preferably, the resin is applied in a layer having a cured thickness of about 20 to about 50 microns. After coating with adhesive resin, the resin coated copper is then partially cured or b-staged. A second layer of resin may be applied to the surface of the b-staged resin layer. If a second layer of resin is applied, then the second layer of resin is b-staged during which time the first layer typically becomes essentially fully cured. The final product is an adhesive resin coated conductive coated metal foil that is useful in standard printed circuit board manufacturing techniques.

EXAMPLE 1

Two resin compositions, the first including a bromine-containing fire retardant Composition I (Table I) and the second one including a halogen free fire-retardant Composition II (Table II) were prepared according to the recipes set forth in the Tables below.

TABLE 1

| INGREDIENT DESIGNATION | INGREDIENT NAME | 1000 PART FORMULA | WT % |
|---|---|---|---|
| AS0007 (BT2110) | Bistriazine Resin (Mitsubishi) | 390.60 | 39.06 |
| AS0014 (Quatrex) | Brominated Flame Retardant | 153.07 | 15.31 |
| AS0004 (PKHS-40) | Phenoxy resin (40% solids - M.W. @ 20,000) - Used as a flexibilizer/resin | 229.76 | 22.98 |
| AS0015 (EPON 1031A70) | Bis-Phenol-A epoxy resin | 19.13 | 1.91 |
| 9817Q (EPN 1138MAK80) | Epoxidized phenoiic novolac resin | 134.19 | 13.42 |
| AS0740 (DER 732) | Epoxy resin | 38.25 | 3.83 |
| 9799s (PKHP-200) | Solid phenoxy resin (M.W. @ 20,000) | 30.63 | 3.06 |
| AS0024 (BYK-341) (optional) | fatty acid surfactant | 2.91 | 0.29 |
| AS0028 (L122) (optional) | fatty acid surfactant | 1.46 | 0.15 |

TABLE 2

| INGREDIENT DESIGNATION | INGREDIENT NAME | 1000 PART FORMULA | Wt % NET WEIGHT |
|---|---|---|---|
| AS0007 (BT2110) | Bistriazine Resin (Mitsubishi) | 390.60 | 39.1 |
| A50004 (PKHS-40) | Phenoxy resin (40% solids - M.W. @ 20,000) - Used as a flexibilizer/resin | 224.12 | 22.4 |
| AS0015 (EPON 1031A70) | Bis-Phenol-A epoxy resin | 19.13 | 1.9 |
| 9817Q (EPN 1138MAK80) | Epoxidized phenolic novolac resin | 134.19 | 13.4 |
| A50740 (DER 732) | Epoxy resin | 38.25 | 3.8 |
| Melamine cyanurate | Halogen-free flame retardant | 153.07 | 15.3 |
| 97995 (PKHP-200) | Solid phenoxy resin (M.W. @ 20,000) | 30.63 | 3.1 |
| Z-6040 Silane | Surfactant | 10 | 1.0 |
| TOTALS | | 999.99 | 100.00 |

EXAMPLE 2

The peel strengths of copper foils coated with the resins prepared in Example were evaluated. The adhesive resins prepared in Example 1 were applied to copper foils having a thickness of 18 microns. The copper foils used were supplied by various manufactures. The adhesive resin was applied to the copper foil in a two step process. In the first step, the resin was applied to the copper foil in a layer 35 microns thick. The adhesive resin was b-staged and then second layer of resin 35 microns thick was applied to the b-staged adhesive resin layer and the second layer adhesive resin was partially cured.

The adhesive resin coated foil was laminated to a 8-ply board and then cured at 200° C. at 200 psi for 90 minutes. The copper foil layer was then peeled from the laminate to determine the resin peel strength. Peel strength results are reported in Table 3, below.

TABLE 3

| Foil/Manufacturer | Resin Type | Peel Strength (lbs/in) |
| --- | --- | --- |
| TWX - Circuit Foils | Compound I | 7.0 |
| TWX - Circuit Foils | Compound II | 7.45 |
| MLP - Oak Mitsui | Compound I | 7.1 |
| MLP - Oak Mitsui | Compound II | 7.2 |
| ML - Oak Mitsui | Compound I | 4.8 |
| ML - Oak Mitsui | Compound II | 5.84 |
| MLS - Oak Mitsui | Compound I | 4.65 |
| MLS - Oak Mitsui | Compound II | 5 |
| JTCS - Gould | Compound I | 4.65 |
| JTCS - Gould | Compound II | 4.55 |
| JTCSHP - Gould | Compound I | 7.05 |
| JTCSHP - Gould | Compound II | 7.19 |

The peel strength results reported in Table 3 and in FIG. 2 show that halogen-free resin compositions of this invention provide equal or superior peel strengths in comparison with bromine containing flame retardant resin compositions of the prior art.

What we claim is:

1. A flame-retardant adhesive resin composition comprising;
   at least one resin; and
   at least one halogen-free flame retardant composition wherein the resin composition includes essentially no halogen containing flame-retardant compositions wherein the halogen-free flame retardant is melamine cyanurate having a particle size of from 1 to about 20 microns.

2. The flame-retardant adhesive resin composition of claim 1 wherein the resin is an epoxy resin.

3. The flame-retardant adhesive resin composition of claim 1 wherein the halogen-free flame retardant is present in the composition in an amount ranging from about 10 to about 20 wt %.

4. The flame-retardant adhesive resin composition of claim 1 wherein the halogen-free flame retardant is present in the composition in an amount ranging from about 12 to about 17 wt %.

5. The flame-retardant adhesive resin composition of claim 1 wherein the melamine cyanurate particle size is less than about 12 microns.

6. The flame-retardant adhesive resin composition of claim 1 comprising at least one resin and from about 12 to about 17 wt % melamine cyanurate having a particle size of from about 1 micron to about 12 microns.

7. An adhesive resin coated conductive metal foil having a first surface and a second surface wherein the first surface includes a flame-retardant resin layer comprising at least one resin, and at least one halogen-free flame retardant composition wherein the resin includes essentially no halogen containing flame-retardant compositions and wherein the flame retardant resin layer has a thickness of from about 35 to about 100 microns.

8. The adhesive resin coated conductive metal foil of claim 7 wherein the conductive metal is copper.

9. The adhesive resin coated conductive metal foil of claim 7 wherein the resin is applied as a single layer having a thickness of from about 20 to about 100 microns.

10. The adhesive resin coated conductive metal foil of claim 7 wherein the resin layer includes a first resin layer and a second resin layer wherein the first resin layer is at least partially cured before the second resin layer is applied to the top of the first resin layer.

11. The adhesive resin coated conductive metal foil of claim 7 wherein the flame-retardant resin includes at least one epoxy resin.

12. The adhesive resin coated conductive metal foil of claim 7 wherein the resin halogen-free flame retardant is selected from the group consisting of melamine cyanurate, melamine cyanurate encapsulated red phosphorous, phosphoric acid, 1,3-phenylenetetraphenyl phosphoric acid ester, Di-polyoxyethylene-hydroxymethylphosphonate, and mixtures thereof.

13. The adhesive resin coated conductive metal foil of claim 7 wherein the halogen-free flame retardant composition is melamine cyanurate.

14. The adhesive resin coated conductive metal foil of claim 7 wherein the halogen-free flame retardant is present in the resin composition in an amount ranging from about 10 to about 30 wt %.

15. A printed circuit board including the adhesive resin coated conductive metal foil of claim 7.

* * * * *